United States Patent
Laurent et al.

(10) Patent No.: US 7,311,239 B2
(45) Date of Patent: Dec. 25, 2007

(54) PROBE ATTACH TOOL

(75) Inventors: Edward T. Laurent, North Wales, PA (US); Dan Mironescu, Yoqneam Illite (IL)

(73) Assignee: SV Probe Pte Ltd., Singapore (SG)

( * ) Notice: Subject to any disclaimer, the term of this patent is extended or adjusted under 35 U.S.C. 154(b) by 174 days.

(21) Appl. No.: 10/900,161

(22) Filed: Jul. 27, 2004

(65) Prior Publication Data

US 2005/0247755 A1  Nov. 10, 2005

Related U.S. Application Data

(60) Provisional application No. 60/568,036, filed on May 4, 2004.

(51) Int. Cl.
*B23K 37/00* (2006.01)
(52) U.S. Cl. .............. 228/4.5; 228/110.1; 228/1.1
(58) Field of Classification Search ............... 228/1.1, 228/4.5, 41, 180.5, 904; 219/56, 56.1, 85.18, 219/448.19, 121.64
See application file for complete search history.

(56) References Cited

U.S. PATENT DOCUMENTS

| | | | | |
|---|---|---|---|---|
| 2,170,432 A * | 8/1939 | Schwarzkopf | ............... | 75/238 |
| 3,941,298 A * | 3/1976 | Nicklaus | ............... | 228/180.5 |
| 4,415,115 A * | 11/1983 | James | ............... | 228/170 |
| 4,517,252 A * | 5/1985 | Hugh | ............... | 428/553 |
| 4,928,871 A * | 5/1990 | Farassat | ............... | 228/180.5 |
| 5,284,287 A * | 2/1994 | Wilson et al. | ........ | 228/180.22 |
| 5,421,503 A * | 6/1995 | Perlberg et al. | ............... | 228/4.5 |
| 5,653,381 A * | 8/1997 | Azdasht | ............... | 228/254 |
| 5,926,029 A * | 7/1999 | Ference et al. | ............... | 324/762 |
| 5,934,543 A * | 8/1999 | Koduri | ............... | 228/102 |
| 5,938,951 A * | 8/1999 | Azdasht | ............... | 219/121.64 |
| 6,321,971 B1 * | 11/2001 | Jin et al. | ............... | 228/6.2 |
| 6,564,989 B2 * | 5/2003 | Arakawa | ............... | 228/180.5 |
| 6,703,855 B1 | 3/2004 | Wu et al. | | |

FOREIGN PATENT DOCUMENTS

JP   62 254058 A   11/1987
JP   63 012968 A   1/1988

OTHER PUBLICATIONS

International Search Report for PCT International Application No. PCT/US2005/011126, mailed Jul. 12, 2005.
Patent Cooperation Treaty, "Notification Concerning Transmittal of International preliminary Report on Patentability (Chapter 1 of the Patent Cooperation Treaty)," PCT/US2005/011126 (60148-0103), 9 pages.
Claims from Published App., PCT/US2005/011126 (60148-0103), pp. 11-14.

* cited by examiner

*Primary Examiner*—Jonathan Johnson
*Assistant Examiner*—Michael Aboagye
(74) *Attorney, Agent, or Firm*—Hickman Palermo Truong & Becker LLP; Edward A. Becker

(57) ABSTRACT

A tool for attaching fine preformed probes to a substrate for use with a vacuum source is disclosed. The apparatus comprises a body portion; a tip portion disposed at one end of the body portion; a first orifice extending from a first end of the body portion to the working tip; and at least one second orifice extending from an outer portion of the working tip and communicating with the first orifice, wherein the vacuum source is coupled to the body portion so that a vacuum generated by the vacuum source is provided to the at least one second orifice.

14 Claims, 7 Drawing Sheets

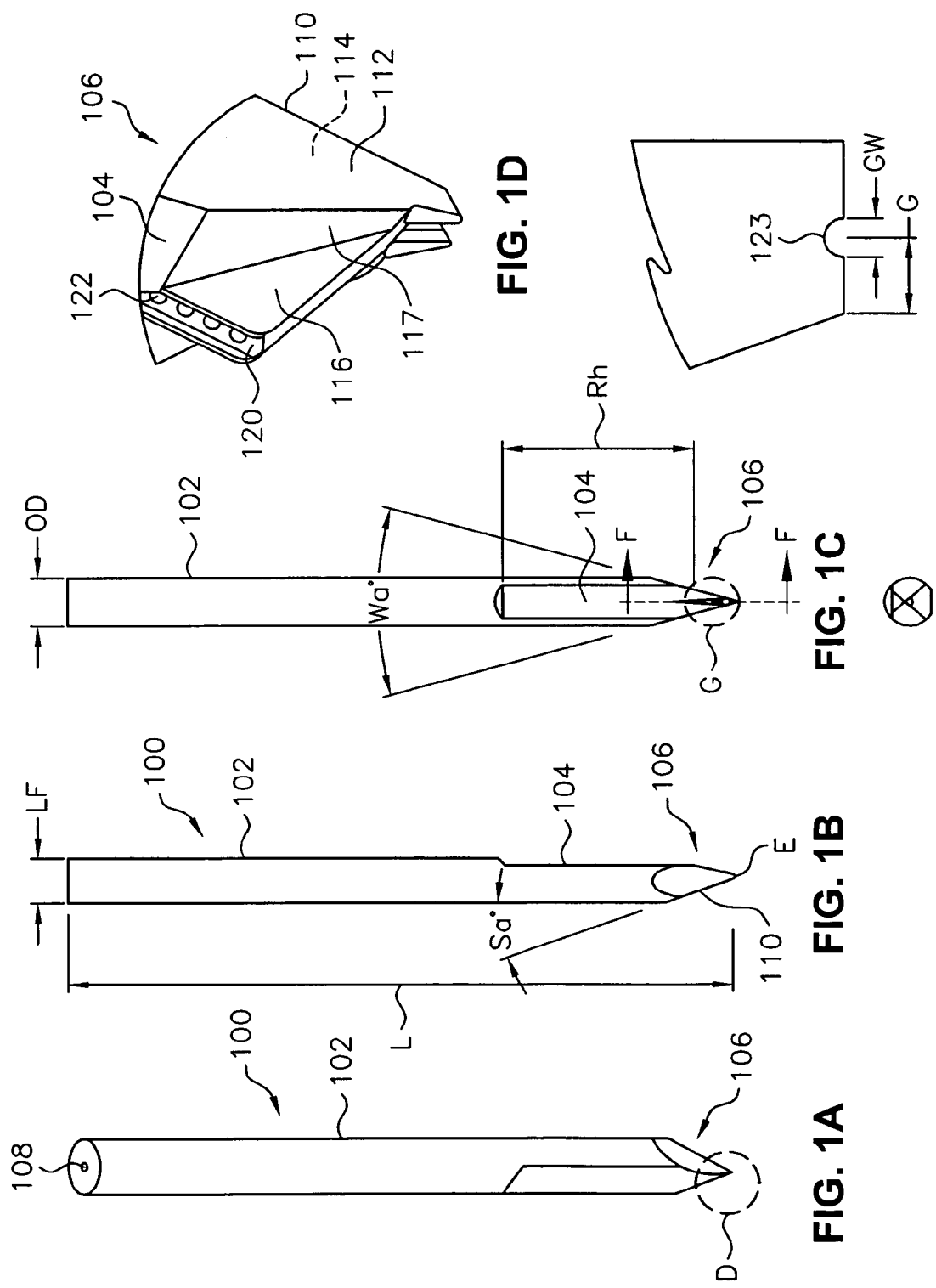

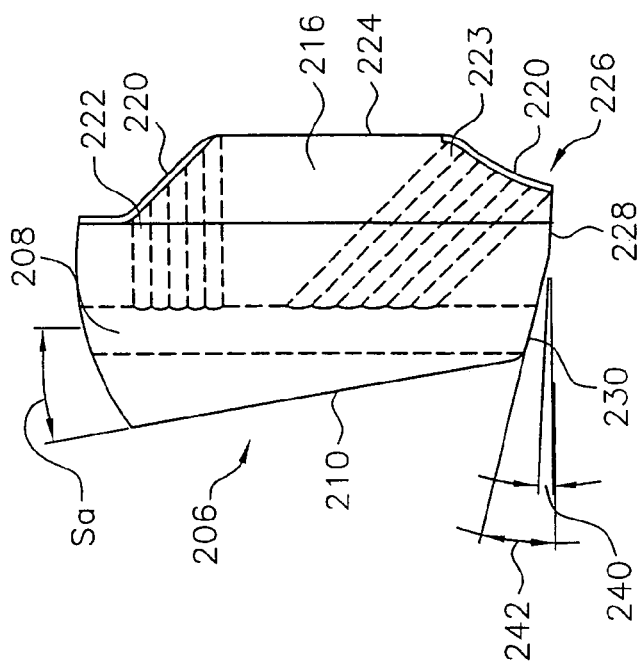
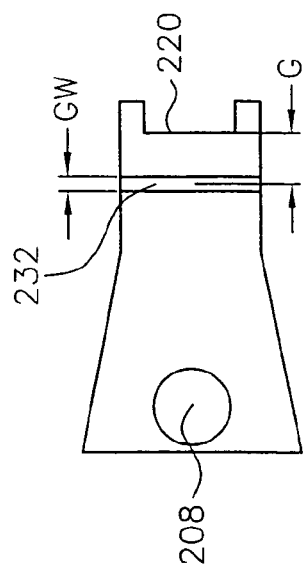
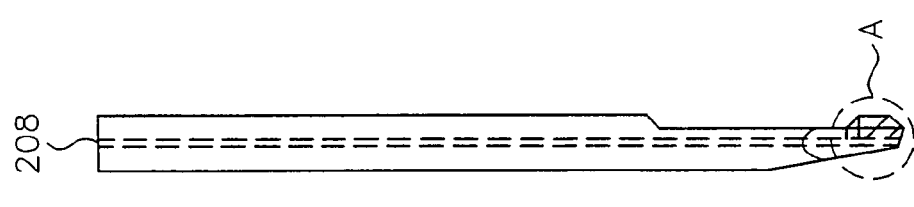
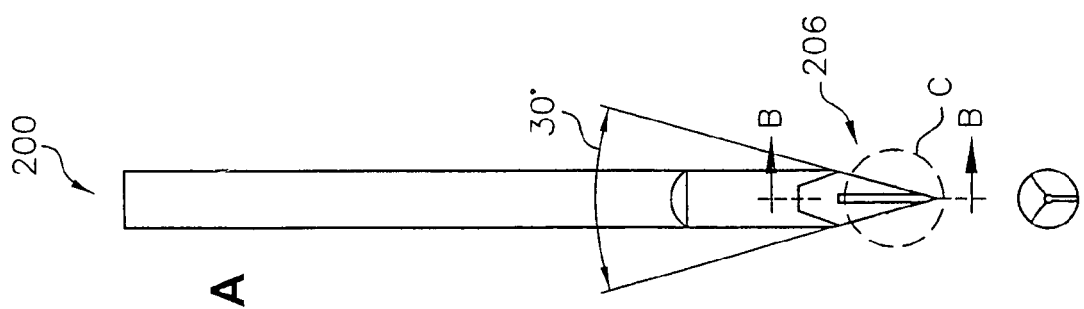
FIG. 2A
FIG. 2B
FIG. 2C
FIG. 2D
FIG. 2E

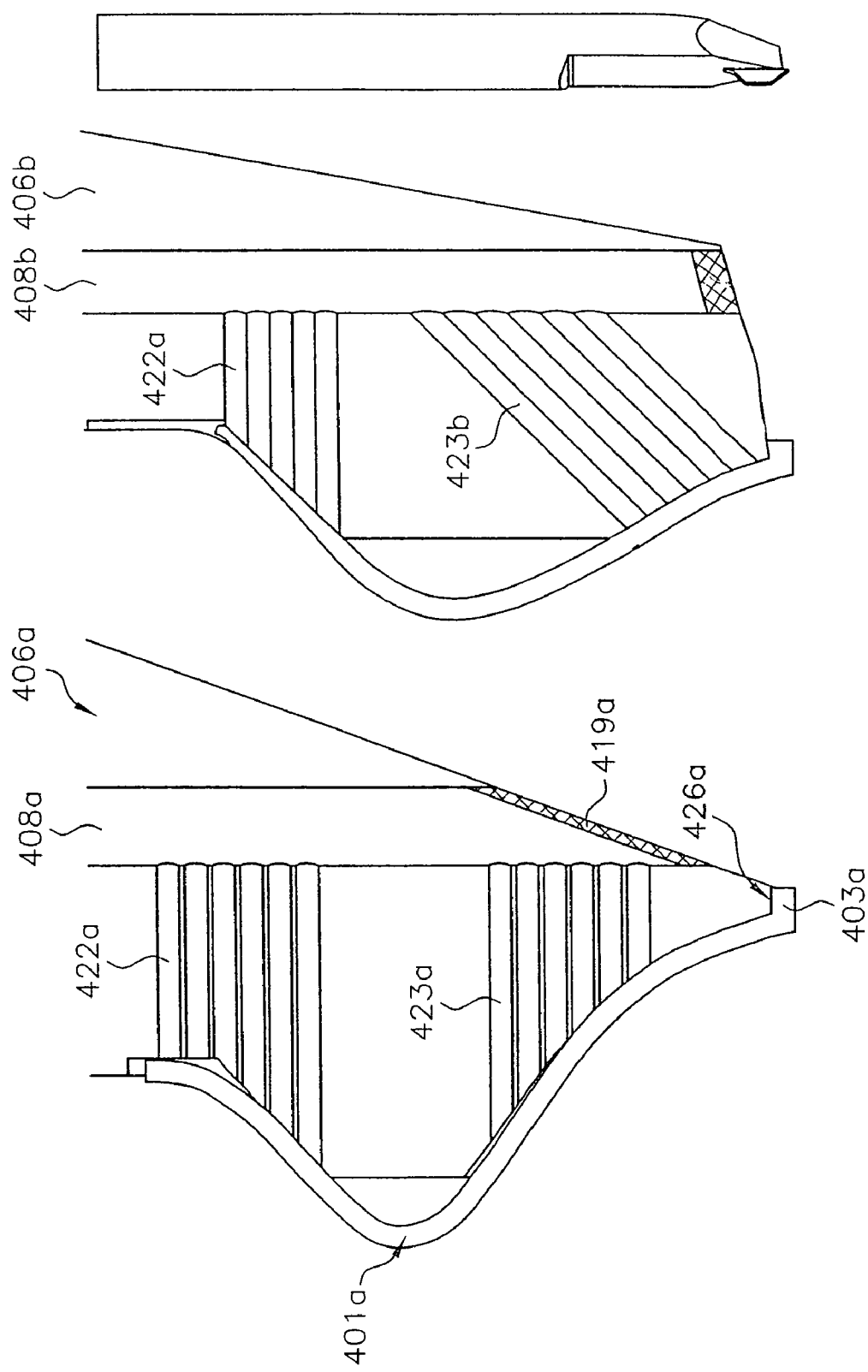

PROBE ATTACH TOOL

This application claims priority on provisional application Ser. No. 60/568,036, filed on May 4, 2004.

FIELD OF THE INVENTION

The present invention relates to fine wire bonding on a substrate. More particularly, the present invention is related to bonding a preformed probe to a substrate to facilitate testing of the substrate.

BACKGROUND OF THE INVENTION

Traditionally, fine wires of gold and aluminum are employed in wire bonding to make electrical interconnections between two or more electrodes on semiconductor devices. The most common wire interconnection made on a semiconductor is made between the conductive pad on a semiconductor chip and a conductive terminal which is adjacent the chip and which serves as an output lead to the connector pins of the package in which the semiconductor chip is contained. One well-known device commonly used to make such connections is a wedge bonding tool. In wedge bonding an end of a fine wire supplied from a spool of wire is fed through a hole in the bonding tool. The end of the wire is then pressed against the bonding pad and scrubbed at a high frequency to create the bond by the transfer of molecules between the pad and the wire. The fine wire is then severed by tearing or breaking the fine wire at the second bond.

In instances where testing of integrated circuit chips is required, it is desirable to connect test leads or probes to select points on the chip's testcard substrate. As mentioned above, conventional wedge bonding tools connect a length of wire to a bond pad, but then must be cut or otherwise severed from the supply wire spool. This has several drawbacks including possible break of the bond at the testcard substrate, inconsistent wire lengths and increased time to complete the many connections necessary to adequately populate the chip with probes.

Accordingly, there is a need to provide an apparatus and method for attaching precut or singulated preformed probes to devices to facilitate testing.

SUMMARY OF THE INVENTION

In view of the deficiencies in the prior art, the present invention is a tool for attaching fine preformed probes to a substrate for use with a vacuum source. The apparatus comprises a body portion with a tip portion disposed at one end of the body portion. A first orifice extends from a first end of the body portion to the working tip, and at least one second orifice extends from an outer portion of the working tip and communicates with the first orifice. The vacuum source is coupled to the body portion so that a vacuum generated by the vacuum source is provided to the at least one second orifice.

According to another embodiment of the present invention, the tip portion has a profile that substantially matches a profile of the probes.

According to still another embodiment of the present invention, the vacuum is communicated to the at least one second orifice to secure a probe to the tip portion.

According to yet another embodiment of the present invention, the at least one second orifice is a plurality of second orifices, with a first portion of the plurality of second orifices disposed along a first portion of the tip portion and a second portion of the plurality of second orifices disposed along a second portion of the tip portion.

According to a further embodiment of the present invention, the tip portion comprises a first wedge portion formed at a first face of the tip portion and a second wedge portion projecting from a second face of the tip portion.

According to still a further embodiment of the present invention, the is first face is disposed on an opposite side of the tip portion from the second face of the tip portion.

According to yet a further embodiment of the present invention, the tip portion further comprises a slot disposed within a face of the second wedge portion, such that the second orifices communicate with the slot.

According to another embodiment of the present invention, the first orifice extends from the top through the bottom of the tool, and a lower portion of the orifice is sealed to permit fluid tight communication with the at least one second orifice.

According to still a further embodiment of the present invention, a working tip is disposed at a lower portion of the tip portion.

According to yet another embodiment of the present invention, the at least one second orifice extends through the working tip, and an end portion of the at least one second orifice is sealed to provide fluid tight communication with the first orifice.

According to still another embodiment of the present invention, the tip portion comprises a plurality of facets. A first facet being formed at a first angle relative to the longitudinal axis of the body portion, two second facets being formed adjacent opposite sides of the first facet and having at an overall angle relative to the longitudinal axis of the body portion, and a third facet adjacent each of the two second facets and formed at an angle relative to the longitudinal axis of the body portion.

According to a further embodiment of the present invention, the bonding tool comprises a plurality of facets, i) a first facet formed at a first angle relative to the longitudinal axis of the body portion, and ii) two second facets adjacent opposite sides of the first facet and formed at an overall angle relative to the longitudinal axis, a first projection adjacent each of the two second facets and extending a predetermined distance from the tip portion; and a slot disposed along a length of the first projection, the at least one second orifice terminating at the slot.

An exemplary method for attaching a preformed probe to a substrate according to the present invention comprises the steps of: providing a vacuum to the bonding tool; communicating at least a portion of the vacuum to an exterior surface of the bonding tool; coupling the preformed probe to a portion of the exterior surface of the bonding tool based on the vacuum; bonding a portion of the probe to the substrate; removing the vacuum from the bonding tool; and releasing the probe from the bonding tool.

These and other aspects of the invention will become apparent from the detailed description and accompanying drawing.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following Figures:

FIGS. 1A-1H are various illustrations of a first exemplary embodiment of the present invention;

FIGS. 2A-2G are various illustrations of a second exemplary embodiment of the present invention;

FIGS. 4A-4C are views illustrating a bonding probe captured by a bonding tool according to the present invention prior to bonding.

DETAILED DESCRIPTION OF THE INVENTION

Figures 1F, 1G:
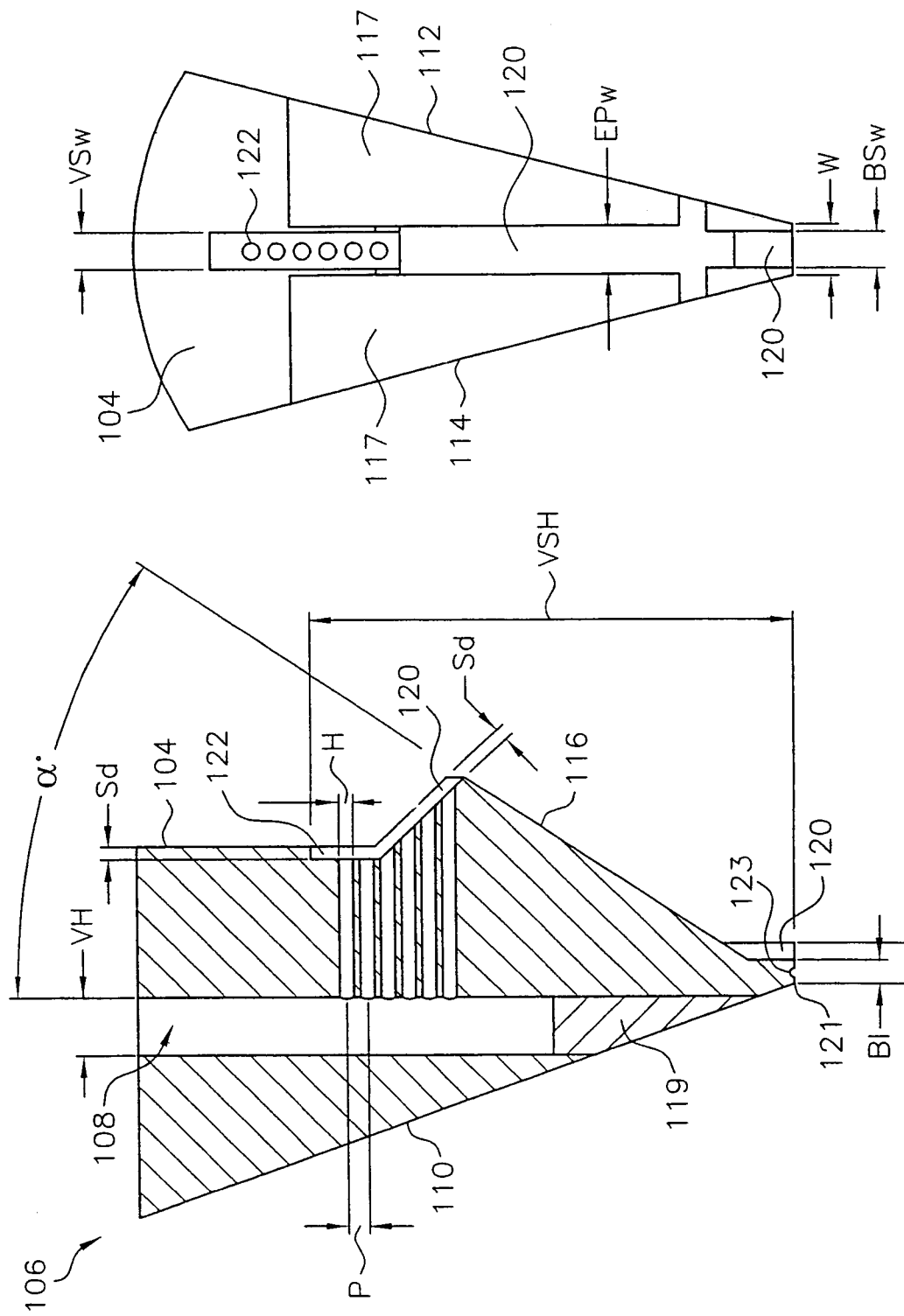

Referring now to FIGS. 1A-1G a first exemplary embodiment of the present invention is illustrated. As shown in FIG. 1A, wedge bonding tool 100 comprises a body portion 102 and a tip portion 106 having an overall length L between about 0.437 and 2.5 inches. In one desirable non-limiting embodiment overall length L is about 0.86 inches. Wedge bonding tool 100 may be formed from any suitable material, such as Titanium Carbide or Tungsten Carbide, for example. Wedge bonding tool 100 is used to attach fine wires, such as singulated probe leads (not shown in this figure), to a substrate such as a semiconductor device (not shown). The aforementioned probe leads may be supplied from a magazine (not shown) with the bonding tool and magazine being moved toward one another to provide the probe leads to the bonding tool. The bonding tool and magazine are subsequently separated from one another and the probe is moved into position for bonding.

FIG. 1B illustrates a side view of bonding tool 100. As shown in FIG. 1B, body portion 102 may include planar area 104 disposed at a lower portion of body portion 102 and above tip portion 106. In the embodiment as illustrated, planar portion 104 continues into tip portion 106. As can be seen, tip portion 106 is multifaceted and comprises a rear face 110 having a predetermined angle Sa relative to the longitudinal axis of the tool. Angle Sa is referred to herein as the "Tool Throat Angle" and, in one non-limiting exemplary embodiment, is between about 10 and 30 degrees. In one desirable non-limiting embodiment angle Sa is about 10 degrees. To facilitate positioning in the bonding machine (not shown) a locating flat LF may be provided. In general LF may be between 0.046 and 0.11 inches. In one non-limiting embodiment LF is about 0.059 inches. As illustrated in FIG. 1B, in one exemplary embodiment locating flat LF extends from the top of bonding tool 100 to planar area 104.

FIG. 1C illustrates a front view of bonding tool 100. As shown in FIG. 1C, bonding tool 100 has an outside diameter OD of between about 0.0625 and 0.125 inches and planar portion 104 having an overall length Rh (also referred to as the "release height") of between about 0.1 and 2.0 inches. When viewed from the front of tool 100, tip portion 106 has a V shape forming an overall angle Wa (Wedge Angle) of between about 10 and 50 degrees. In one non-limiting exemplary embodiment body portion 102 has an outside diameter OD of about 0.0625 inches, Rh is about 0.25 inches and Wa is about 30 degrees. As shown in FIG. 1H, the combination of locating flat LF and outside diameter OD may result in bonding tool 100 having a non-uniform cross section.

Referring now to FIGS. 1D, 1F and 1G a detailed perspective view, a detailed side view and a detailed front view, respectively, of tip portion 106 are illustrated. As shown in FIG. 1D, tip portion 106 comprises side faces 112 and 114, rear face 110 and front face 117. Each of these faces is set at an angle with respect to the longitudinal axis of bonding tool 100. Rear face 110 has an angle Sa of between about 10 and 30 degrees, side faces 112 and 114 form an overall angle Wa of between about 10 and 50 degrees, and front face 117 has an angle a of between about 10 and 55 degrees. This latter angle a is termed by the inventors as "the foot clearance" and chosen to avoid interference with adjacent probes. In one non-limiting exemplary embodiment, Sa is about 10 degrees, Wa is about 30 degrees, and α is about 34 degrees.

Orifice 108 having a diameter VH of between about 0.003 and 0.04 inches extends from the top of body portion 102 into tip portion 106. In one desirable embodiment, VH is about 0.007 inches. For ease of manufacture it may be desirable to allow orifice 108 to extend through the bottom of tip 106. A plug 119 or other means to seal the bottom of tip 106 may then be inserted into the lower portion of orifice 108. Protrusion 116, having a width EPw between about 0.003 and 0.02 inches, extends from front face 117 and comprises orifices 122, having diameter H between about 0.001 and 0.02 inches, extending inwardly from the outside of protrusion 116. It is also desirable to have more that one orifice 122 spaced apart from one another with a pitch P between about 0.0015 and 0.025 inches. By having multiple orifices 122, vacuum can be provided at various positions along the length of the singulated probe lead ensuring adequate retention to tip portion 106. In one desirable non-limiting embodiment, EPw is about 0.005 inches, H is about 0.0025 inches, and/or P is about 0.0025 inches.

Orifices 122 intersect and are in fluid tight communication with orifice 108. In one non-limiting embodiment, orifices 122 intersect orifice 108 at about a right angle. In one non-limiting exemplary embodiment, the lower edge of protrusion 116 is set at a desired angle a (also referred to by the inventors as "foot clearance"), between about 10 and 55 degrees in order to avoid interference with adjacent probes. In one embodiment, foot clearance a is about 34 degrees. The contour of protrusion 116 is desirably similar to the shape of at least a portion of the probe (as shown in FIGS. 4A-4B for example) to be bonded to the substrate. A slot 120 having a width BSw, termed by the inventors as "Bottom Slot Width," below the vicinity of orifices 122, of between about 0.0015 and 0.015 inches, a width VSw in the vicinity of the orifices 122, termed by the inventors as "Vacuum Slot Width," of between about 0.0015 and 0.015 inches, and a depth Sd, between about 0.0005 and 0.01 inches, may also be disposed along some or all of the face of protrusion 116 to accommodate a portion of a singulated lead probe (not shown in this figure); thus, aiding in positive positioning of the singulated probe adjacent orifices 122 and working face 121. In one non-limiting exemplary embodiment, VSw is about 0.0035 inches, BSw is about 0.0035 inches, and/or Sd is about 0.0015 inches. Further, slot 120 has a dimension VSH as measured from the bottom of tip portion 106 to the top of slot 122, termed by the inventors as the "Vacuum Slot Height," of between about 0.01 and 0.15 inches. In one non-limiting embodiment, VSH is about 0.058 inches. It should be noted that the cross section of slot 120 (best shown in FIG. 2E as slot 220) may comprise a substantially flat bottom or a somewhat curved bottom depending on the type of tool used to form slot 120.

The inventors have determined that it is desirable to use vacuum as a means for extracting individual singulated probes from the magazine (not shown) and to hold the probe in place as the probe is moved into place and bonded to the substrate (not shown). As can be appreciated from the above description and drawings, a vacuum applied to orifice 108 will be presented at the openings of orifices 122 and may be used to capture and retain the singulated lead probe for bonding.

At the bottom of tip 106 working face 121 is provided. Working face 121 comprises a width W between about 0.003 and 0.02 inches and a foot size F between about 0.004 and 0.02 inches. Distance BI, as measured from the bottom of slot 120 to the edge of working face 121, is between about 0.002 and 0.01 inches and determines the bond length of the singulated probe. In a non-limiting embodiment, width W is about 0.005 inches, foot size F is about 0.005 inches and distance BI is about 0.003 inches.

FIG. 1E is an exploded side view of working tip 106 illustrating the position G, of approximately ⅓ of bond length BL, and width GW, between about 0.0005 and 0.003 inches, of groove 123 disposed on the bottom of tip 121. In one non-limiting embodiment, G is about 0.0013 inches and GW is about 0.0005 inches.

Figure 2G:
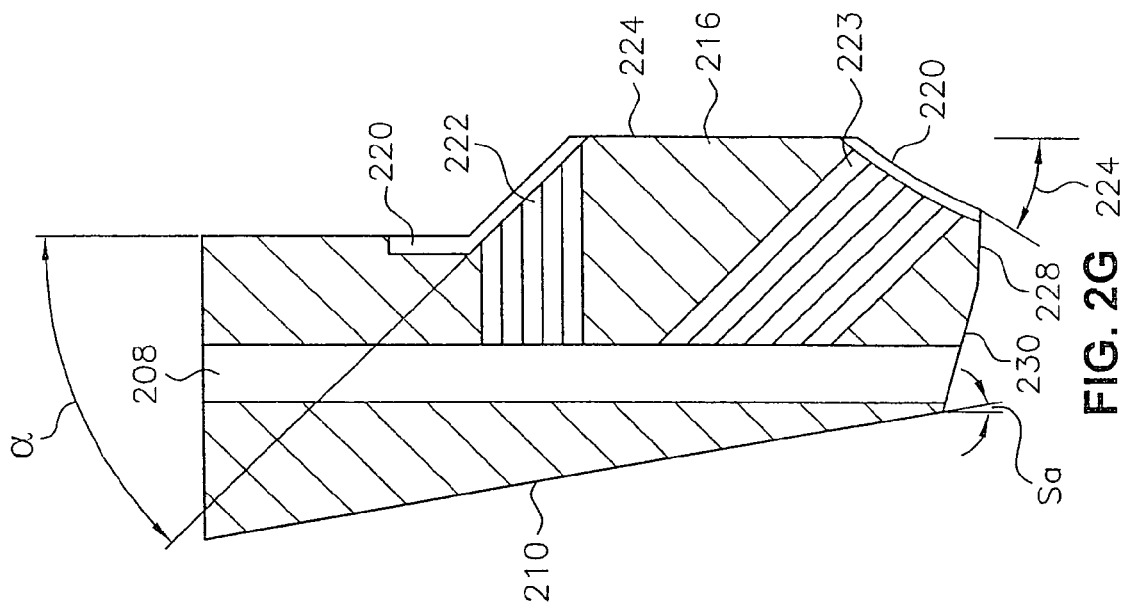
Figure 2F:
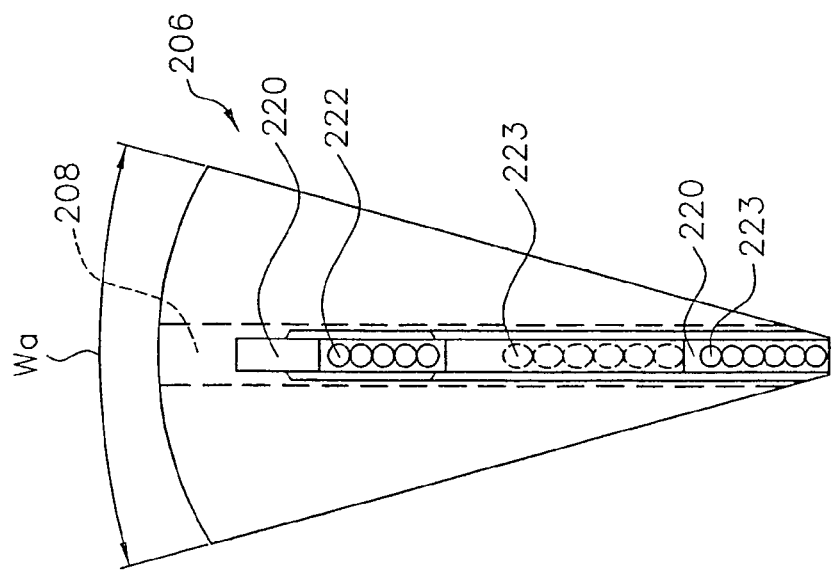

A second exemplary embodiment of the present invention is illustrated in FIGS. 2A-2G. As shown in FIGS. 2A-2G, wedge bonding tool 200 is similar to bonding tool 100 with respect to its general features. The significant difference is in the contour and implementation of tip portion 206. FIG. 2A illustrates a front view of bonding tool 200, FIG. 2B illustrates a side view of Bonding tool 200 and FIG. 2C illustrates a bottom view of bonding tool 200.

FIGS. 2D and 2G illustrate detailed side views and cross sectional views of tip portion 206, respectively. As shown in FIGS. 2D and 2G, rear face 210 is set at an angle Sa of between about 10 and 30 degrees (desirably about 10 degrees) relative to the longitudinal axis of bonding tool 200. Similar to the first exemplary embodiment, orifice 208 extends from the top of bonding tool 200 to the vicinity of orifices 222 and 223, which in turn extend inwardly from the outside edge of protrusion 216. As mentioned above with respect to the first exemplary embodiment, although orifice 208 is shown as extending through the bottom of bonding tool 208, although not required to implement the present invention, this may be done for ease of manufacturing, and that in practice a plug or other type of seal is provided to ensure fluid tight communication of a vacuum from orifice 208 into orifices 222 and 223.

A first set of orifices 222 are disposed at the upper portion of protrusion 222 and a second set of orifices 223. Similar to the first exemplary embodiment, slot 220 may be provided in the vicinity of orifices 222 and/or 223 as desired to provide for positive alignment of the singulated probe with the orifice. As can be appreciated, the addition of orifices 223 provides greater means for retaining the singulated probe to bonding tool 200. As can also be appreciated, still additional orifices may be included at other points along the contour of protrusion 216 as desired where the probe is expected to contact protrusion 216, such as along portion 224. Placing orifices along portions of protrusion 216 where the probe will not contact the protrusion will result in reduced holding power along the portions where the probe does contact the protrusion. In order to provide maximum coverage to desired portions of protrusion 216 it may be necessary to set orifices 222 and/or 223 at an angle relative to the normal of orifice 208. This can be seen in FIGS. 2D and 2G where orifices 223 are angled upward. Further, although orifices 222 could be oriented downward, because such a downward angle would undoubtedly cross into orifices 223 and possibly create occlusions due to the small size of the openings, it is desirable to avoid situations where the orifices 222 and 223 would cross into one another. In order to conform the profile of tip portion 206 to a substantial portion of the singulated probe, angle α for the upper portion of slot 220 may be different from the generalized angle 244 of the lower portion of slot 220.

Working tip 226 is disposed at the bottom of tip portion 206. As illustrated, working tip 226 comprises a first angled portion 228 and a second angled portion 230 adjacent angled portion 228. In one non-limiting embodiment, angled portion 228 has an angle 240 of about 5 degrees and second angled portion 230 has an angle 242 of about 15 degrees.

FIG. 2E illustrates a detailed plan view of the bottom of tip portion 206. As shown in FIG. 2E, groove 232 having a width GW and a depth GD is formed in the bottom face of tip 206 and offset from the bottom of slot 220 by distance G. In one non-limiting embodiment, G is about 0.007 inches, GW is about 0.005 inches, GD is about 0.003 inches and/or the depth of slot 220 is about 0.002 inches at an upper portion and about 0.0015 inches along its interface with orifices 222 and/or 223.

Figure 3A:
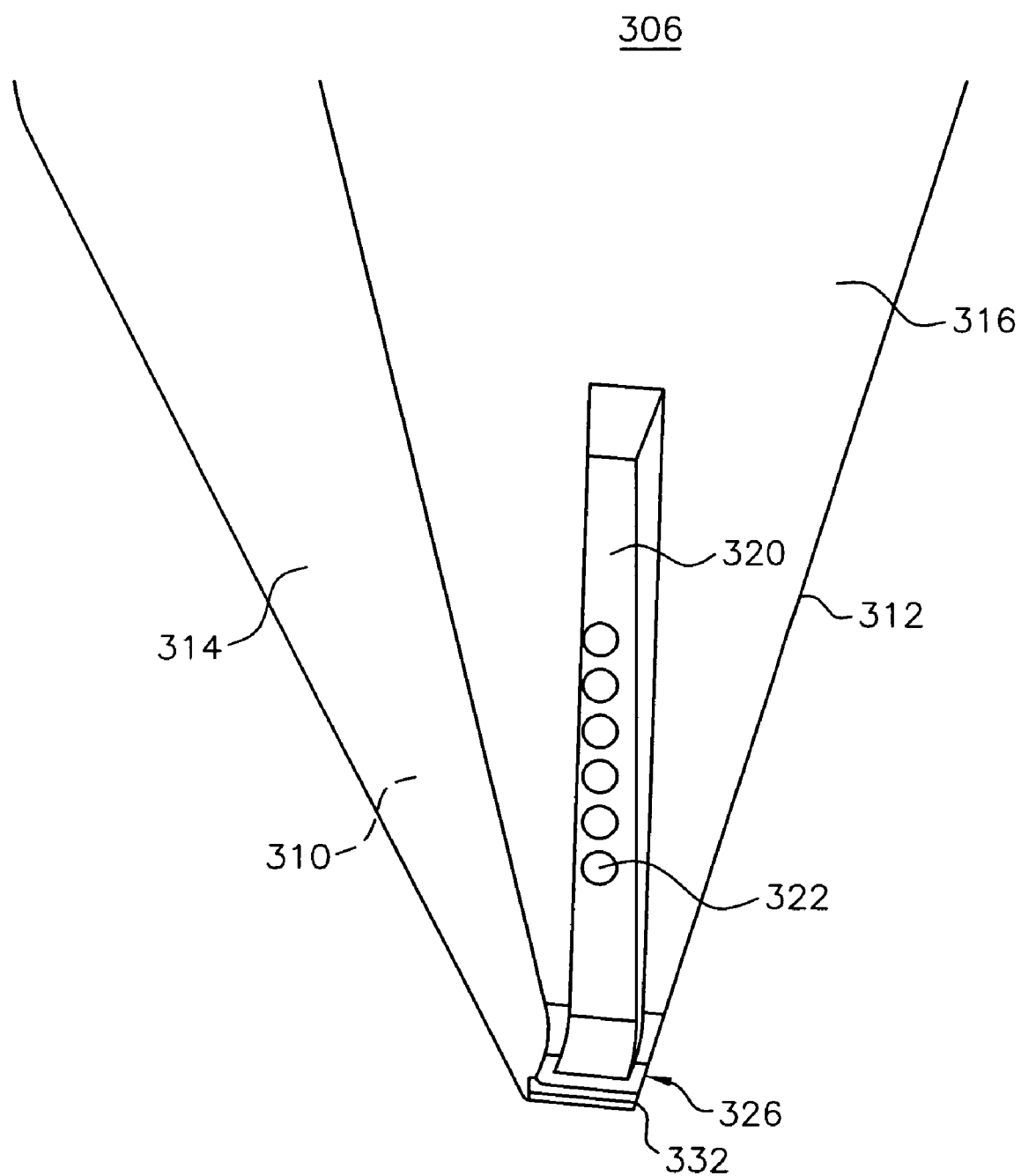
FIGS. 3A-3B are perspective views of a tip of a bonding tool according to another exemplary embodiment of the present invention.
Figure 3B:
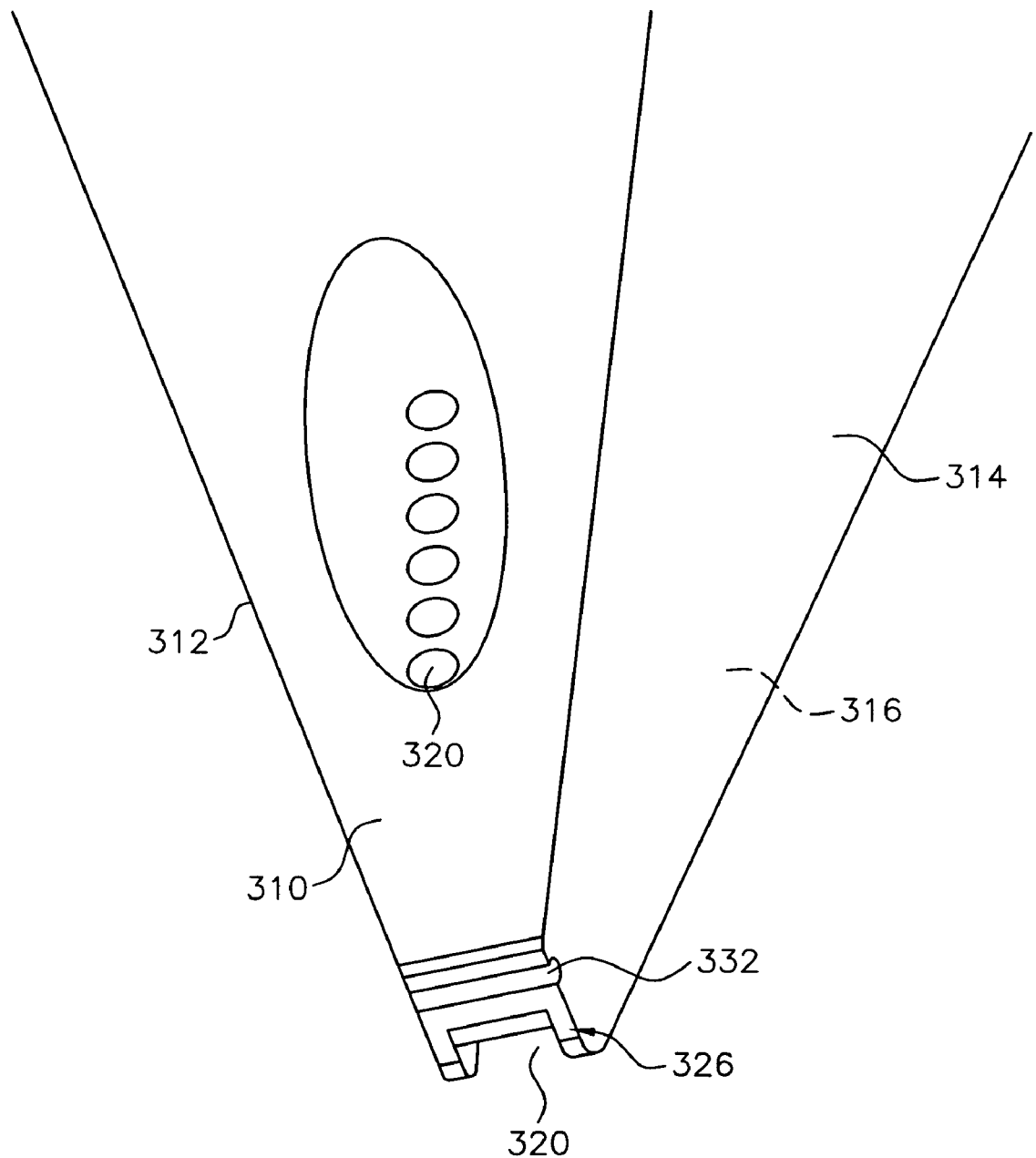

FIGS. 3A and 3B are perspective views of the tip portion of yet another exemplary embodiment of the present invention. As shown in FIG. 3A, tip portion 306 comprises facets 310, 312, 314 and 316, working tip 326 as well as slot 320 and orifices 322. In this exemplary embodiment, rather than having protrusion along which a singulated probe will be coupled by vacuum, the singulated probe will be disposed within slot 320 and coupled thereto by the vacuum. The dimensions of slot 320 are desirably based on the profile of the singulated probe to be bonded. As is understood by those skilled in the art, a portion of the singulated probe will wrap under working tip 326 in order to facilitate bonding to the device (not shown). In one exemplary embodiment, working tip 326 includes a groove 332 similar to that discussed above with respect to the aforementioned embodiments. In all other respects this embodiment is similar to the first and second exemplary embodiments.

Referring now to FIG. 3B, a rear perspective view of tip portion 306 is illustrated. As shown in FIG. 3B, for ease of manufacturing, orifices 320 may extend from one side of tip 306 at front face 316 through to rear face 310. In order to ensure that an adequate amount of vacuum is provided to the side of orifices 320 at slot 320, a sealant or plug may be used along face 310. The sealant or plug may be any of several well-know types.

FIGS. 4A-4C illustrate the coupling of a singulated probe to the bonding tool of the present invention. As shown in FIG. 4A, tip portion 406a is provided with a vacuum from a vacuum source (not shown), which vacuum is in turn communicated to orifices 422a and 423a. The vacuum drawn into these orifices is in turn used to maintain singulated probe 401a in place against a portion of the contour of tip portion 406a. As illustrated, singulated probe 401a does not specifically match the contour of the entirety of tip portion 406a, but has sufficient correlation thereto so that the vacuum is able to hold probe 401a in place as the probe is moved from the dispensing magazine (not shown) to the bonding site (not shown). As is also shown in FIG. 4A, a tail portion 403a of probe 401a is disposed adjacent to working tip 426a to facilitate bonding. Also shown is plug 419a to ensure that sufficient vacuum flows thorough orifices 422a and 423a. As noted above, plug 419a may not be needed if orifice 408a does not extent trough the bottom of the bonding tool.

FIG. 4B illustrates another exemplary embodiment in which the bonding tool has a tip portion 406b and a profile differing from that of FIG. 4A and with orifices 423b that intersect orifice 408b at an angle.

Table 1 is a listing of abbreviations and their associated meanings, as used herein and with reference to the drawing, as well as exemplary non-limiting dimensional ranges and desirable non-limiting dimensions.

TABLE 1

| Abbreviation | Meaning | Range [inches] | Dimension [inches] |
|---|---|---|---|
| L | Tool length | 0.4370-2.5 | 0.8600 |
| P | Vacuum hole Pitch | 0.0015-0.025 | 0.0025 |
| VH | Vertical Vacuum Hole Diameter | 0.003-0.04 | 0.0070 |
| Sd | Slot Depth | 0.0005-0.01 | 0.0015 |
| H | Vacuum Hole Diameter | 0.001-0.02 | 0.0025 |
| VSH | Vacuum Slot Height | 0.01-0.15 | 0.058 |
| Bl | Bond Length | 0.002-0.01 | 0.003 |
| F | Foot Size | 0.004-0.02 | 0.005 |
| á° | Foot Clearance | 10°-55° | 34° |
| VSw | Vacuum Slot Width | 0.0015-0.015 | 0.0035 |
| EPw | External Profile Width | 0.003-0.02 | 0.005 |
| W | Tool Tip Width | 0.003-0.02 | 0.005 |
| BSw | Bottom Slot Width | 0.0015-0.015 | 0.0035 |
| LF | Shank Locating Flat | 0.046-0.11 | 0.059 |
| OD | Shank Out Diameter | 0.0625-0.125 | 0.0625 |
| Sa° | Tool Throat Angle | 10°-30° | 10° |
| G | Groove Location | ~⅓ BL | 0.0013 |
| GW | Groove Width | 0.0005-0.003 | 0.0005 |
| Wa° | Tool Tip Width Angle | 10°-50° | 30° |
| Rh | Release Height | 0.1-2.0 | 0.25 |

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed:

1. An apparatus for attaching a curved elongated probe to a substrate for use with a vacuum source, the apparatus comprising:

a body portion having a first end and a second end;

a tip portion disposed at the first end of the body portion, the tip portion having a first external surface disposed at a first angle with respect to a longitudinal axis of the body portion and a second external surface disposed at a second angle with respect to the longitudinal axis of the body portion, wherein the second angle is different than the first angle, the first external surface having a first elongated slot disposed therein shaped to accept a first portion of the curved elongated probe, the second external surface having a second elongated slot disposed therein shaped to accept a second portion of the curved elongated probe;

a first orifice extending from the second end of the body portion to the tip portion;

a first plurality of second orifices extending from the first elongated slot disposed within the first external surface of the tip portion to the first orifice so that when a vacuum is provided to the first orifice, the vacuum is also provided to the first plurality of second orifices disposed in the first elongated slot to secure the first portion of the curved elongated probe to the first elongated slot disposed in the first external surface of the tip portion and to cover at least two orifices of the first plurality of second orifices; and a second plurality of second orifices extending from the second elongated slot disposed within the second external surface of the tip portion to the first orifice so that when a vacuum is provided to the first orifice, the vacuum is also provided to the second plurality of second orifices disposed in the second elongated slot to secure the second portion of the curved elongated probe to the second elongated slot disposed in the second external surface of the tip portion and to cover at least two orifices of the second plurality of second orifices.

2. The apparatus as recited in claim 1, wherein the tip portion has a profile that substantially matches a profile of the probe.

3. The apparatus as recited in claim 1, wherein the tip portion comprises a first wedge portion projecting from a first face of the tip portion and a second wedge portion projecting from a second face of the tip portion.

4. The apparatus as recited in claim 3, wherein the first face is disposed on an opposite side of the tip portion from the second face of the tip portion.

5. The apparatus as recited in claim 3, wherein first external surface is disposed in the first wedge portion and the second external surface is disposed in the second wedge portion.

6. The apparatus as recited in claim 1, wherein the body portion comprises at least one planar portion formed along a specified length of the body portion.

7. The apparatus as recited in claim 6, wherein the planar portion is adjacent the tip portion.

8. The apparatus as recited in claim 1, wherein the first orifice extends from a top through a bottom of the body portion, and a lower portion of the first orifice is sealed to permit fluid tight communication with the first and second pluralities of second orifices.

9. The apparatus as recited in claim 1, wherein the plurality of second orifices extends through the tip portion and end portions of the first and second pluralities of second orifices are sealed to provide fluid tight communication with the first orifice.

10. The apparatus as recited in claim 1, wherein the tip portion comprises a first facet formed at a first angle Sa relative to the longitudinal axis of the body portion, two second facets adjacent opposite sides of the first facet and formed at an overall angle a relative to the longitudinal axis, and a third facet adjacent each of the two second facets and formed at an angle a relative to the longitudinal axis of the body portion.

11. The apparatus as recited in claim 1, wherein the tip portion comprises:

a first facet formed at a first angle Sa relative to the longitudinal axis of the body portion, two second facets adjacent opposite sides of the first facet and formed at an overall angle Wa relative to the longitudinal axis, a first projection adjacent each of the two second facets and extending a first specified distance from the tip portion, a second projection adjacent each of the two second facets and extending a second specified distance from the tip portion;

wherein the first elongated slot is disposed along a length of the first projection, the first plurality of orifices terminating at the first elongated slot, and wherein the second elongated slot is disposed along a length of the second projection, the second plurality of second orifices terminating at the second elongated slot.

12. The apparatus as recited in claim 1, wherein the apparatus is comprised of a tungsten carbide material.

13. The apparatus as recited in claim 1, wherein the apparatus is comprised of a titanium carbide material.

14. A bonding tool for attaching a curved elongated probe to a substrate for use with a vacuum source, the bonding tool comprising:

means for communicating, via one or more orifices internal to the bonding tool, at least a portion of a vacuum from the vacuum source to a first plurality of orifices disposed in a first elongated slot disposed within a first external surface of the bonding tool for securing a first portion of the curved elongated probe to the first elongated slot disposed within the first external surface of the bonding tool and to cover at least two orifices of the first plurality of orifices, and also to a second plurality of orifices disposed in a second elongated slot disposed within a second external surface of the bonding tool for securing a second portion of the curved elongated probe to the second elongated slot disposed within the second external surface of the bonding tool and to cover at least two orifices of the second plurality of orifices.

* * * * *